United States Patent [19]

Shirai et al.

[11] Patent Number: 5,537,740
[45] Date of Patent: Jul. 23, 1996

[54] METHOD OF MAKING PRINTED CIRCUIT BOARD

[75] Inventors: Masaharu Shirai, Ohtsu; Shuhei Tsuchita, Kusatsu, both of Japan

[73] Assignee: International Business Machines Corporation, Armonk, N.Y.

[21] Appl. No.: 561,533

[22] Filed: Nov. 22, 1995

Related U.S. Application Data

[63] Continuation of Ser. No. 164,124, Dec. 7, 1993, abandoned.

[30] Foreign Application Priority Data

Dec. 28, 1992 [JP] Japan .................................. 4-347638

[51] Int. Cl.⁶ ...................................................... H05K 3/10
[52] U.S. Cl. ............................ 29/852; 174/250; 174/266; 427/97
[58] Field of Search .................................. 29/852; 427/97; 174/250, 266

[56] References Cited

U.S. PATENT DOCUMENTS

| | | | |
|---|---|---|---|
| 4,642,160 | 2/1987 | Burgess | 29/852 X |
| 4,985,600 | 1/1991 | Heerman | 29/852 X |
| 4,996,391 | 2/1991 | Schmidt | 29/852 X |
| 5,108,553 | 4/1992 | Foster et al. | 29/852 X |
| 5,347,712 | 9/1994 | Yasuda et al. | 29/852 |

FOREIGN PATENT DOCUMENTS

| | | | |
|---|---|---|---|
| 4-335596 | 11/1992 | Japan | 29/852 |
| 5-55724 | 3/1993 | Japan | 29/852 |

*Primary Examiner*—Carl J. Arbes
*Attorney, Agent, or Firm*—Lawrence R. Fraley

[57] ABSTRACT

A blind hole extending from upper or surface wiring of a printed circuit board to inner or lower wiring, and having an opening larger than the bottom, is formed on a substrate, and a conductor pattern is formed on the bottom and the internal wall of the blind hole to connect the inner wiring with the surface wiring.

4 Claims, 12 Drawing Sheets

METHOD OF MAKING PRINTED CIRCUIT BOARD

The application is a continuation division of application Ser. No. 08/164,124, filed Dec. 7, 1993 now abandoned.

BACKGROUND OF THE INVENTION

1. Technical Field

This invention relates to a printed circuit board in which the upper wiring is connected with the lower wiring through the conductor pattern on the bottom and internal wall of a blind hole, and a process for the manufacture thereof.

2. Description of the Prior Art

In the manufacture of printed circuit boards, attempts to reduce the land to as little as possible have been made in order to increase their wiring density. A typical example is the landless substrate, in which wiring density is increased by eliminating the land when connecting wiring using plated through hole (PTH).

Such a landless substrate has, as FIG. 3 shows for example, a PTH with a plated layer 5 on the internal wall of a through hole 2 formed in the substrate 1, to connect the connection line 3 on the top with the connection line 4 on the bottom. Such a landless substrate is formed by applying a resin layer in the internal wall of the through hole, plating the resin layer with solder, and etching off the solder plating, leaving a positive photoresist on the vertical wall (internal wall) of the solder plating.

However, in such a landless substrate it is impossible to connect the inner lines 6, as shown in FIG. 3, with the vertical wall of the solder plating. On the other hand, it is possible to connect the inner lines 6 with the vertical wall of the solder plating without forming a resin layer on the internal wall of the through hole. FIG. 4 shows the connection thus formed. (A) is a top view and (B) is a sectional view. As these diagrams show, when the inner lines 6 are thus connected with a plated layer 7, the connection area is only the width×thickness of the inner lines 6. Therefore, the connection of the inner lines 6 with the plated layer 7 lacks reliability.

As FIG. 5 shows, landless via connection is also feasible by forming a drill hole to the middle of the thickness direction of the substrate 1 so as to cut the inner lines 6, and forming a plated layer 8 by etching using the positive photoresist on the internal wall of the drill hole as described above. In this case, however, connection reliability cannot be obtained.

On the other hand, a structure to connect upper wiring, outer layer wiring, for example, with inner layer wiring, using a blind hole which reaches the inner wiring, i.e., lower layer wiring, has been known. The process for manufacturing such a structure is shown in FIG. 6. As FIG. 6 shows, a photosensitive resin layer 13 is applied to the substrate 11 so as to cover wiring 12 which will become the inner wiring formed on the substrate 11 (FIG. 6(a)), the photosensitive layer 13 is irradiated through a mask pattern 14 having a mask 14a the size of the blind hole so as to expose parts other than the mask pattern (FIG. 6(b)), and is developed to form a blind hole 15 extending to the inner wiring 12 (FIG. 6(c)). Then, a conductor layer 16 is formed on the bottom and the internal wall of the blind hole 15 and the surface of the substrate 11 (FIG. 6(d)), a dry film photoresist 17 is applied so as to cover the blind hole 15, and the photoresist 17 is exposed through a mask pattern 18 having a mask 18a of a size slightly larger than the opening of the blind hole 15 covering the bottom, even if a certain misalignment is considered, to expose parts of the photoresist 17 other than the mask 18a (FIG. 6(e)). Then, a resist pattern to cover the opening of the blind hole 15 is formed by developing (FIG. 6(f)). Then, a conductor pattern 16a having a land around the opening of the blind hole 15 and being connected to the inner wiring 12 are created by etching. A structure to connect the inner wiring 12 with surface wiring through the conductor pattern 16a is formed by forming the surface wiring (not shown) on the substrate 11 continuous to the land of the conductor pattern 16a using a known method.

Although reliability of connection with the inner wiring is obtained by the structure as shown in FIG. 6, the requirement of increasing wiring density cannot be met because of the presence of a land around the opening of the blind hole.

Therefore, an object of this invention is to provide a printed circuit board to connect the upper layer wiring with lower layer wiring, and to achieve a high wiring density, as well as a process for manufacturing such a printed circuit board.

Another object of this invention is to provide a printed circuit board in which the inner wiring are reliably connected and to realize a high wiring density.

SUMMARY OF THE INVENTION

To achieve the above objects, this invention relates to a printed circuit board having upper and lower wiring, wherein a blind hole is formed which extends to said lower wiring and the opening of which is larger than the bottom thereof. A conductor pattern is then formed on the bottom and the internal wall of said blind hole for connecting said upper wiring with said lower wiring. It also relates to a process for producing a printed circuit board comprising the steps of forming a blind hole on a printed circuit board having inner layer wiring, which blind hole extends to the inner layer wiring and the opening of the blind hole being larger than the bottom thereof, forming a conductor layer at least around the blind hole and on the bottom and the internal wall of the blind hole, the conductor layer connected with the inner layer wiring, forming a positive photoresist layer on the surface of the conductor layer, and forming a resist pattern on the bottom and the internal wall of the blind hole by exposing the pattern through a light shield pattern larger than the bottom of the blind hole but smaller than the opening of the blind hole. Thus developing the pattern, as well as forming a conductor pattern by etching part of the conductor layer other than the part of the resist pattern.

In the printed circuit board of the structure as described above, connection with lower wiring can be achieved reliably by the conductor pattern on the bottom of the blind hole, while connection with upper wiring can be achieved reliably by the conductor pattern on the internal surface of the blind hole, and since no land exists around the opening of the blind hole, high-density wiring is realized.

In the manufacturing method described above, by setting up a positive photoresist layer on the surface of the electrically conductive layer, in tandem with exposing and developing it through a masking pattern possessing a masking section larger than the bottom of said blind hole, but smaller than the opening of the blind hole, both the bottom and the opening of the blind hole, are covered, yet it is possible to form a resist pattern, with the perimeter of the opening having been completely removed. In such exposure, although a part of the photoresist on the internal wall of the blind hole is irradiated, only little resist on the internal wall is removed because this internal wall is slanted against the direction of irradiation, and the irradiation dose is less than that around the opening, therefore, by subsequent etching, a conductor pattern continuously extending almost all area of the bottom and the internal wall of the blind hole.

Other features and advantages of this invention will become apparent from the following detailed description of the presently preferred embodiment of the invention, taken in conjunction with the accompanying drawings.

DESCRIPTION OF THE PREFERRED EMBODIMENT

Figure 1:
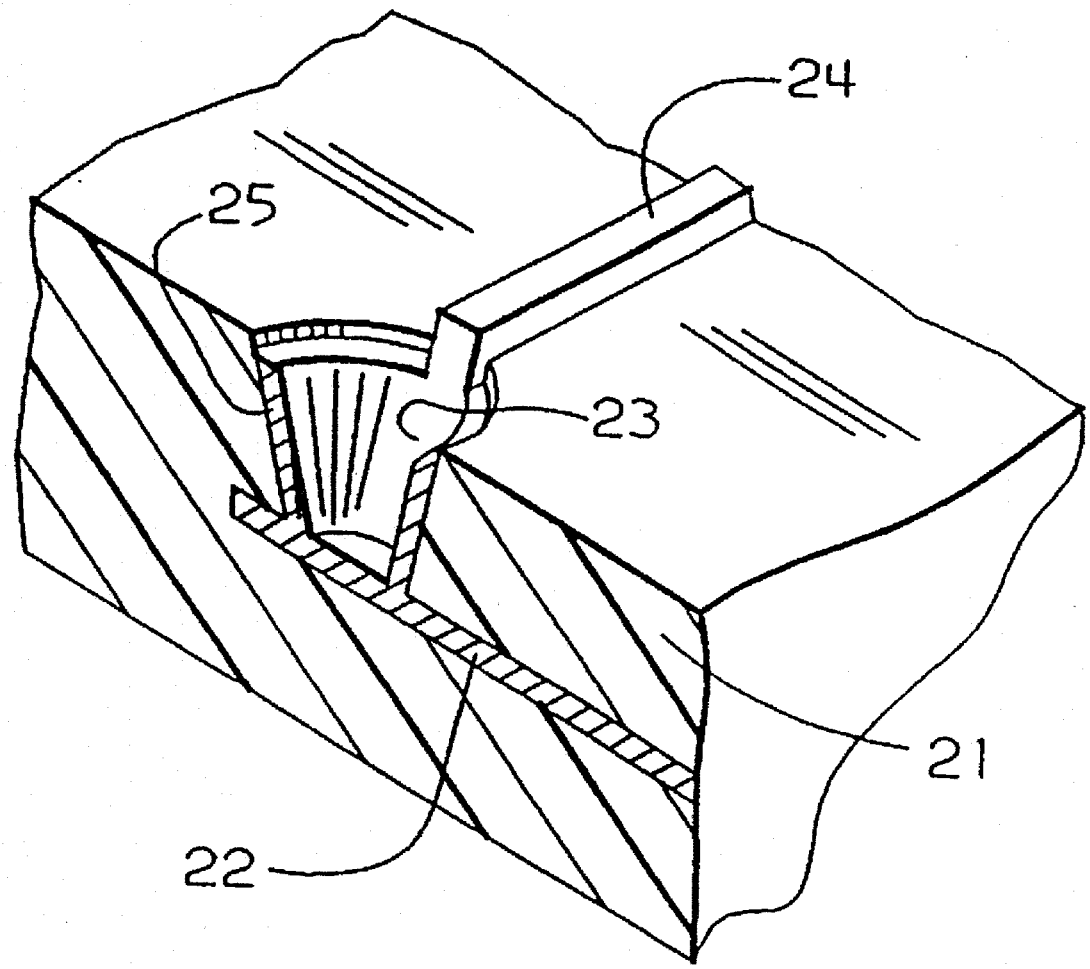
FIG. 1 is a schematic diagram showing a printed circuit board according to an embodiment of this invention.
Figure 1:
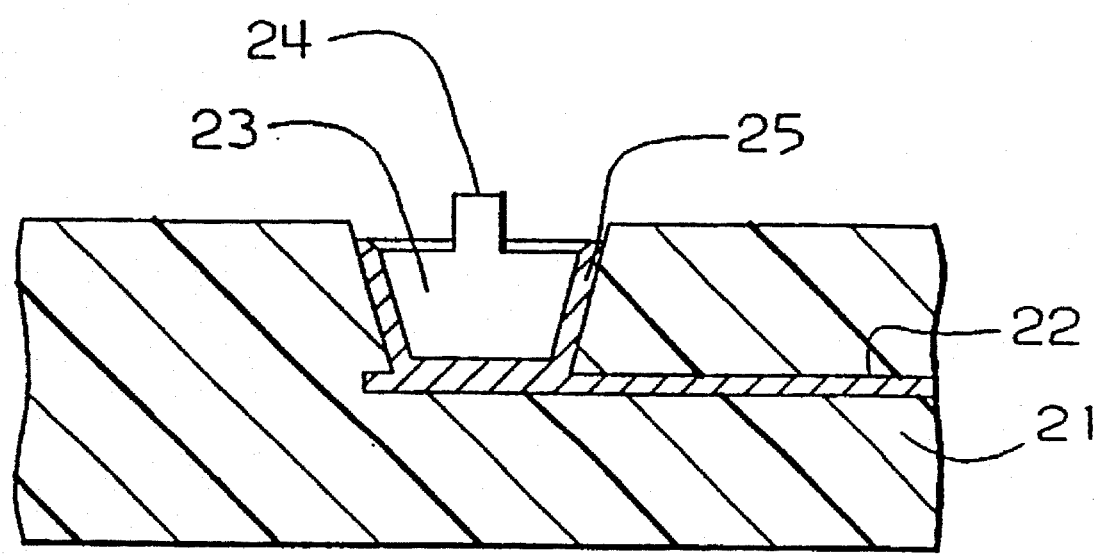
Figure 2A:
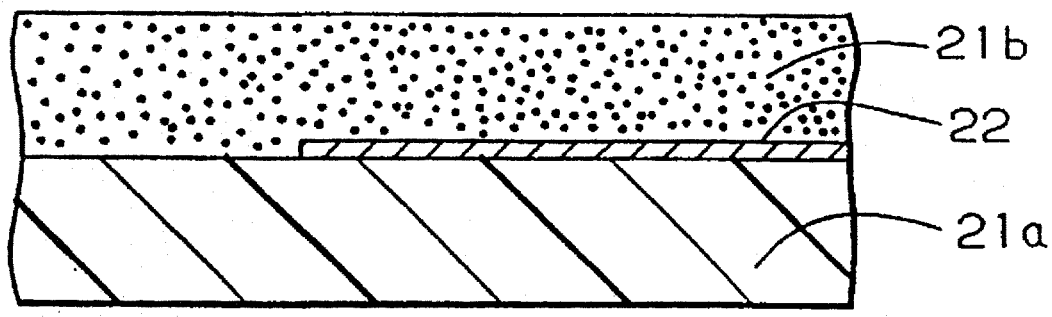
FIG. 2 is a process diagram showing an example of the process for manufacturing a printed circuit board according to this invention.
Figure 2B:
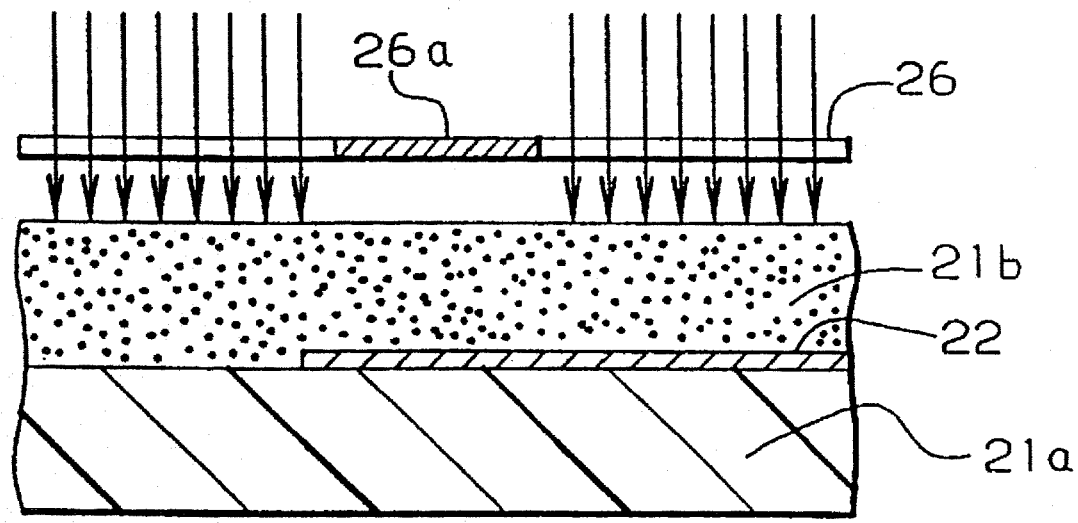
Figure 2C:
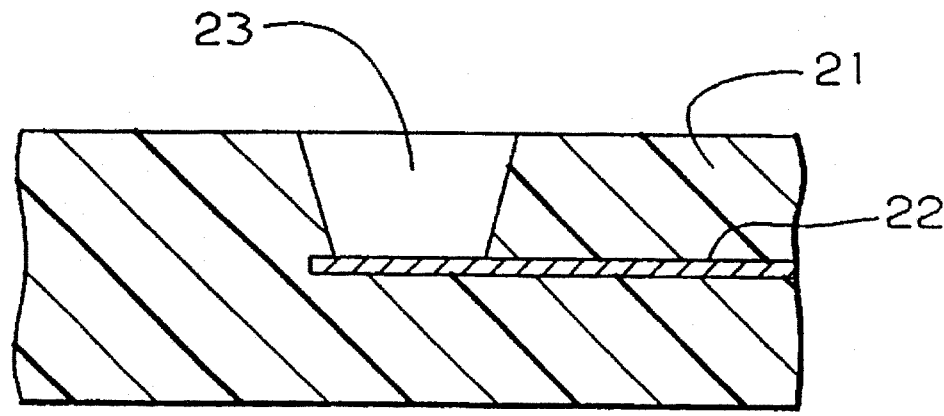
Figure 2D:
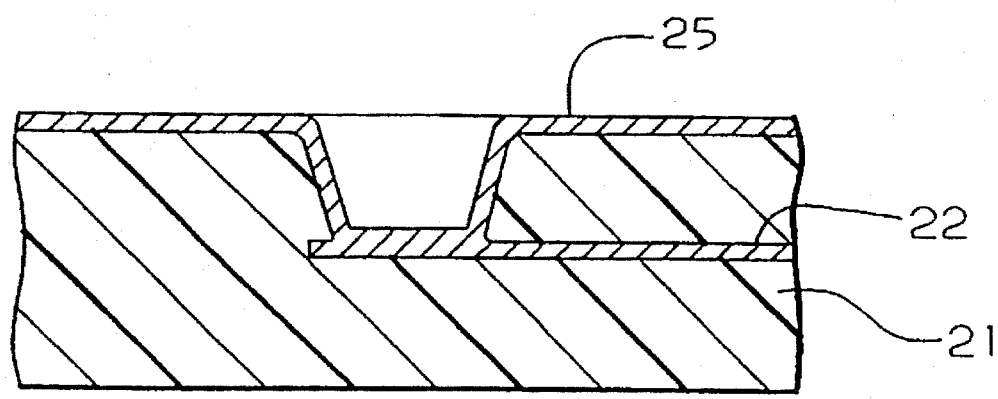
Figure 2E:
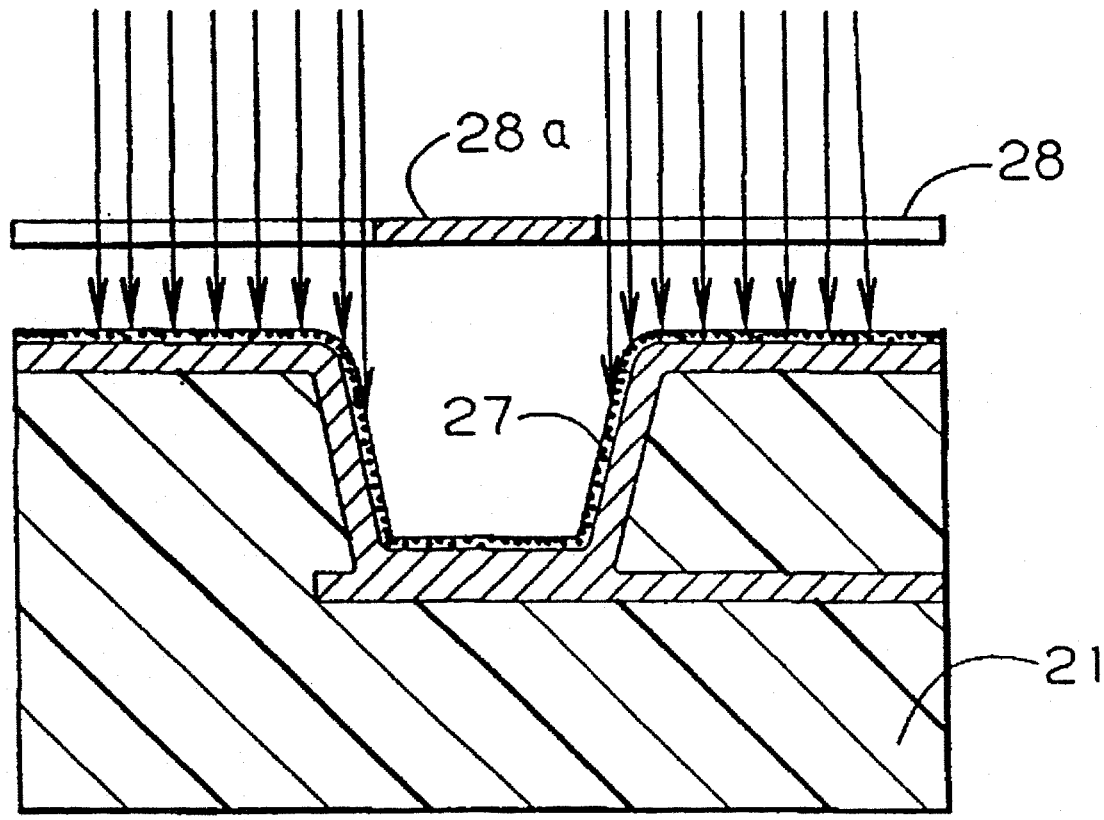
Figure 2F:
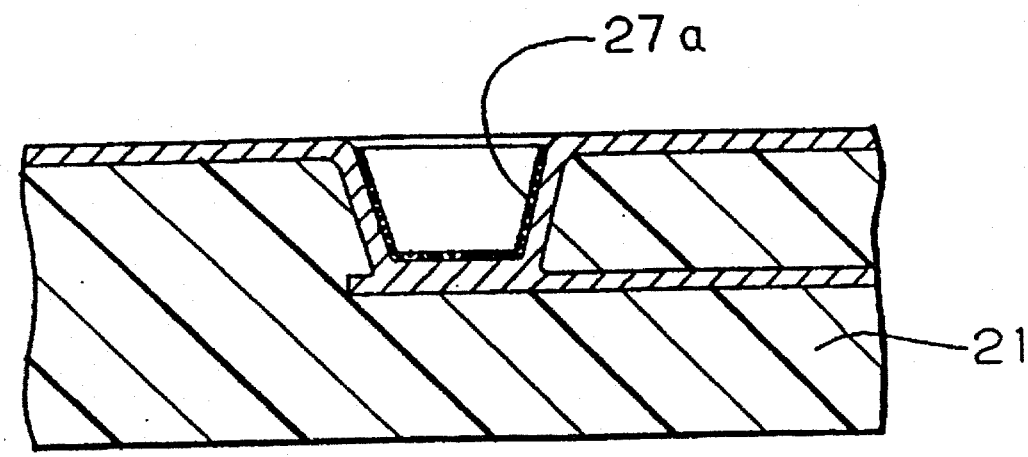
Figure 2G:
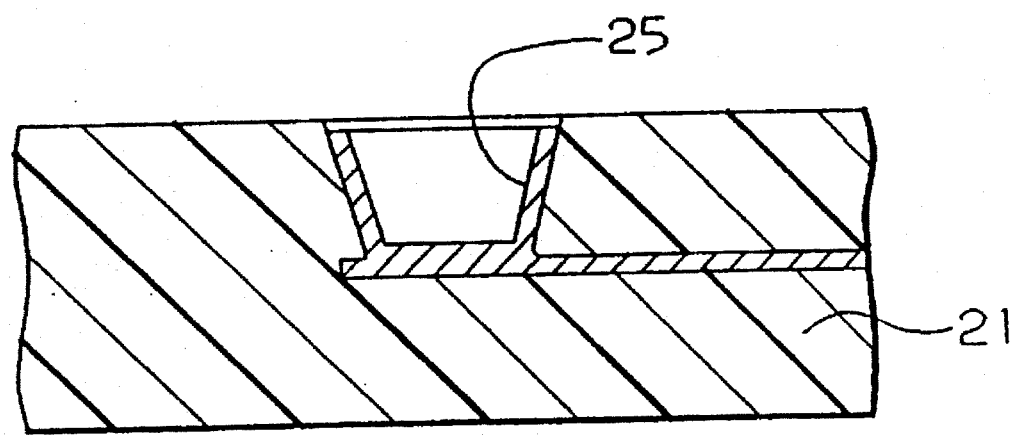
Figure 3:
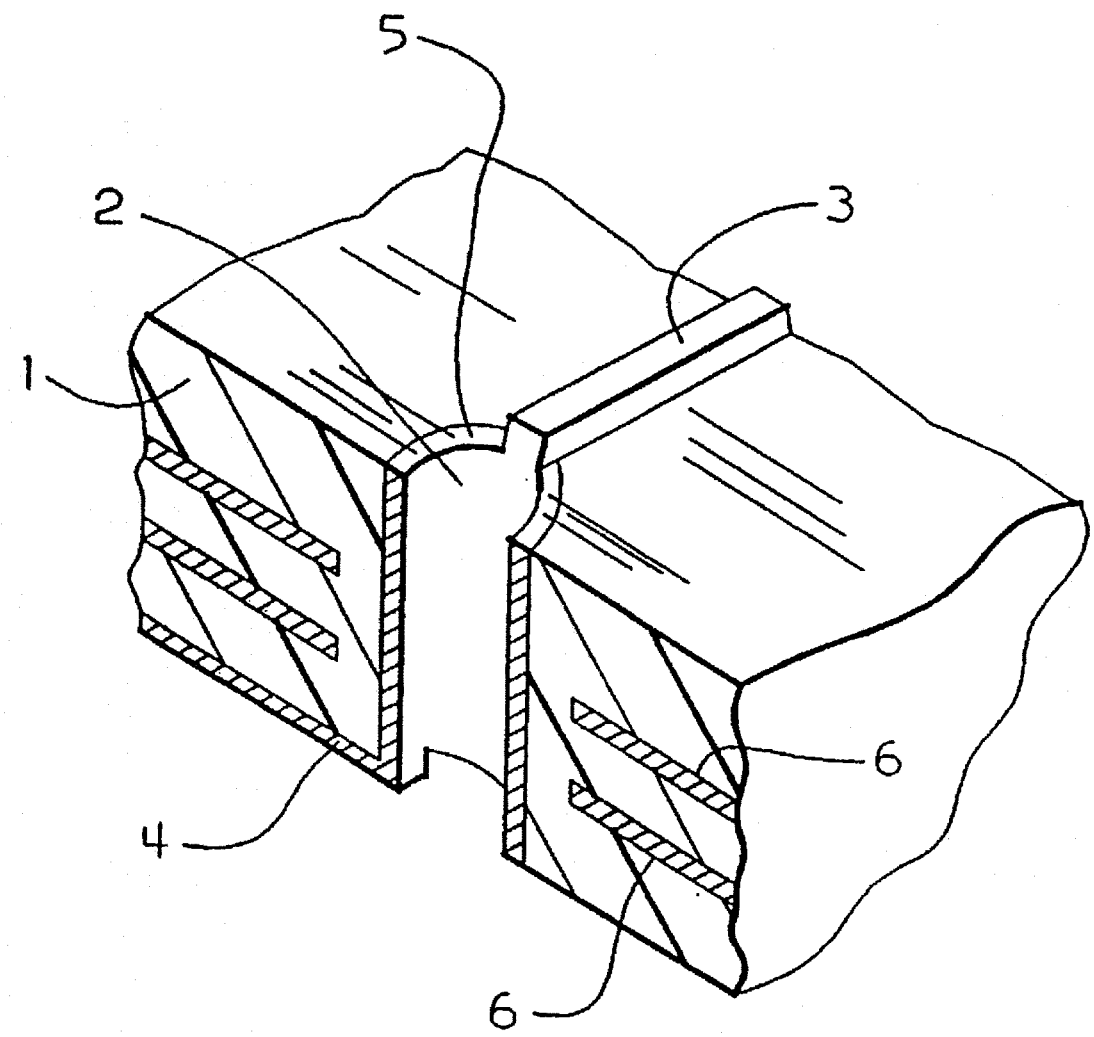
FIG. 3 is a schematic diagram showing an example of a printed circuit board according to the prior art.
Figure 4A:
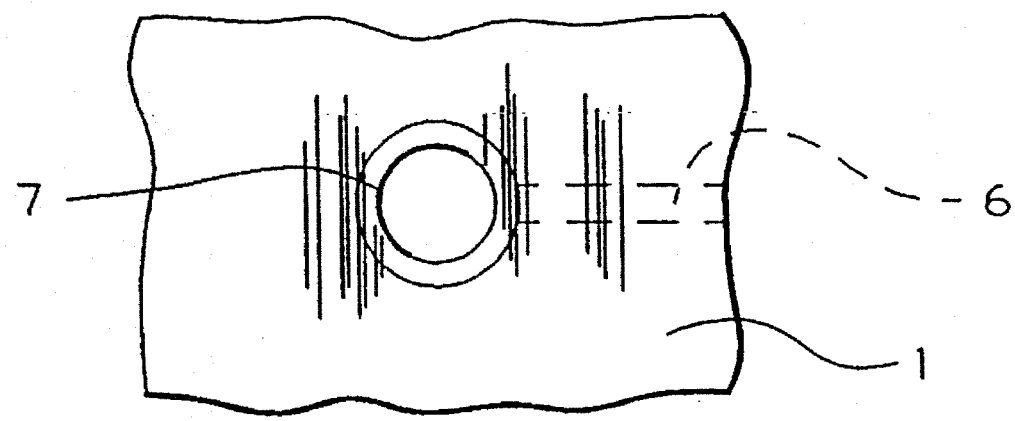
FIG. 4 is schematic diagrams illustrating the problems in the prior art.
Figure 4B:
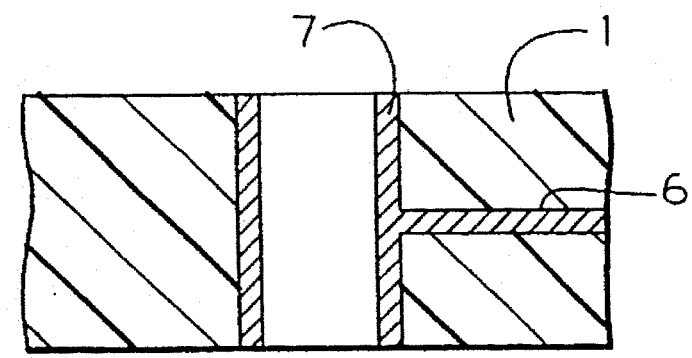
Figure 5:
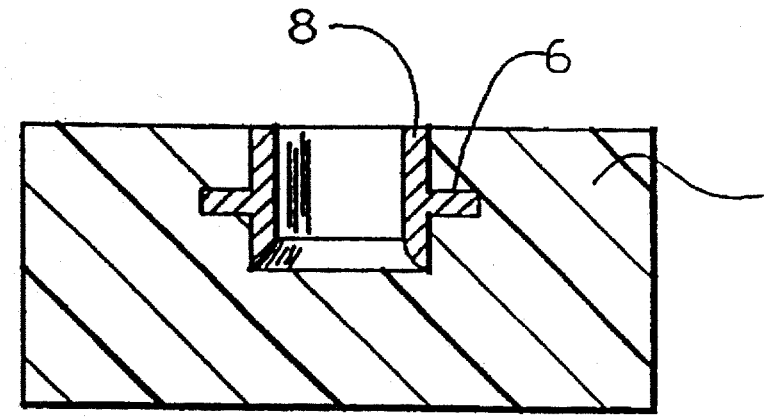
FIG. 5 is a schematic diagram illustrating the problems in the prior art.
Figure 6A:
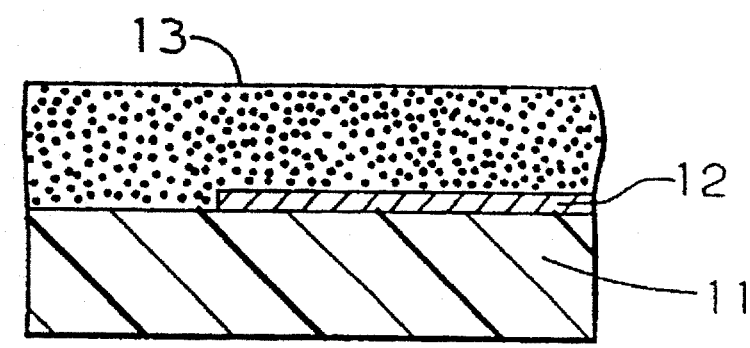
FIG. 6 is a process diagram showing an example of the process for manufacturing a printed circuit board according to the prior art.
Figure 6:
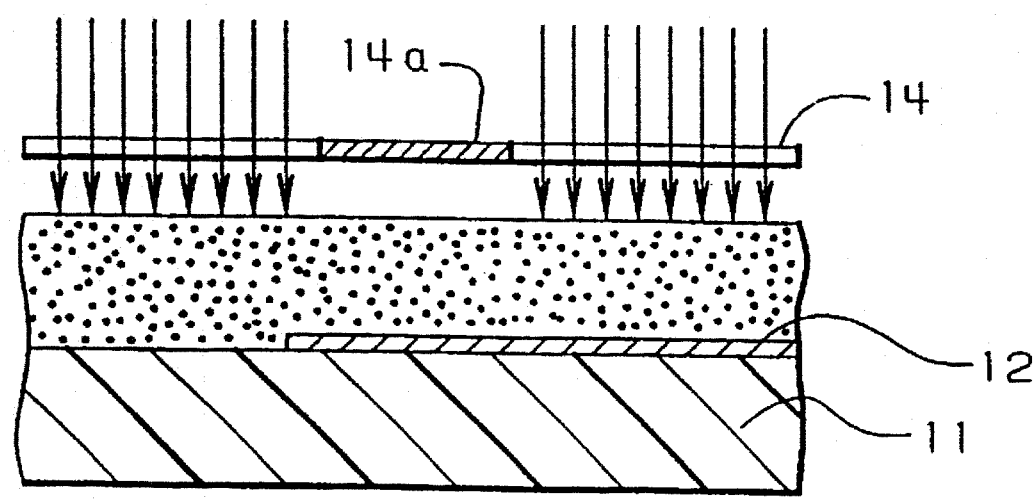
Figure 6:
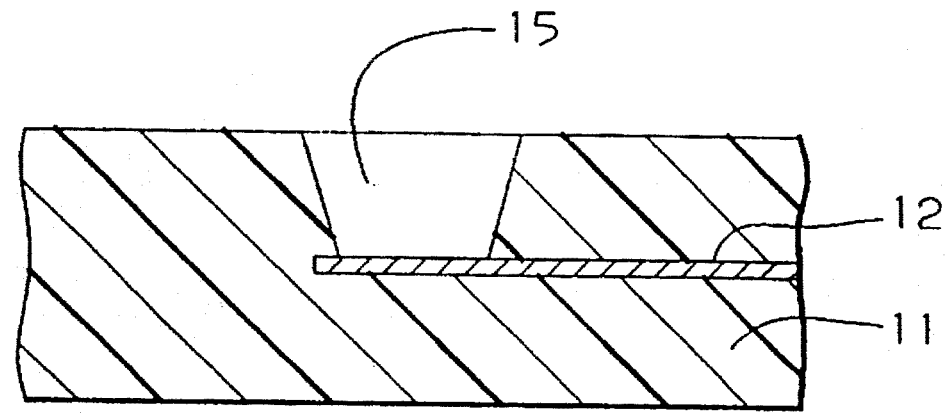
Figure 6:
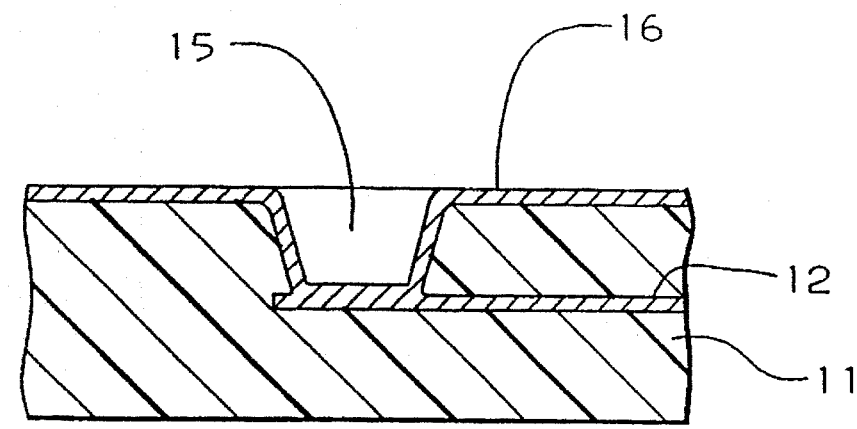
Figure 6:
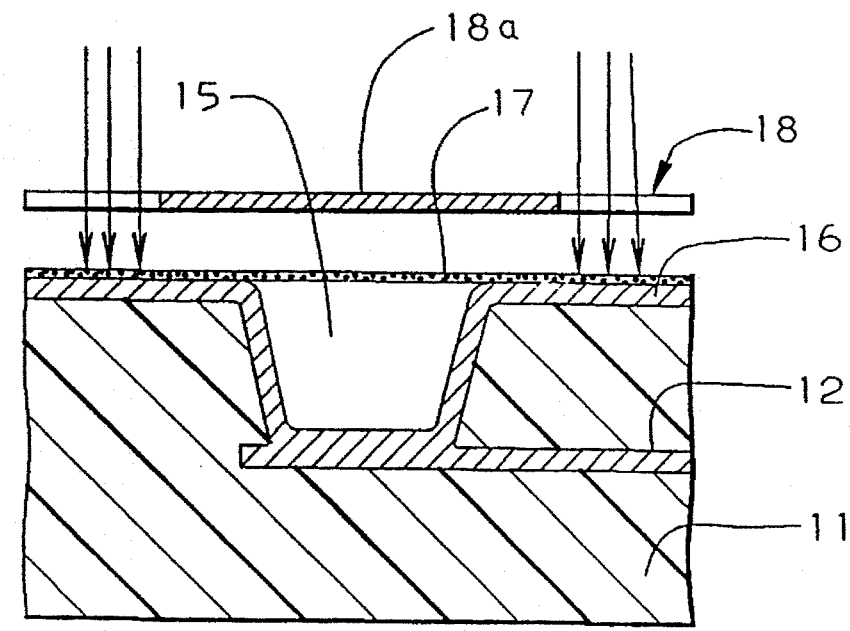
Figure 6:
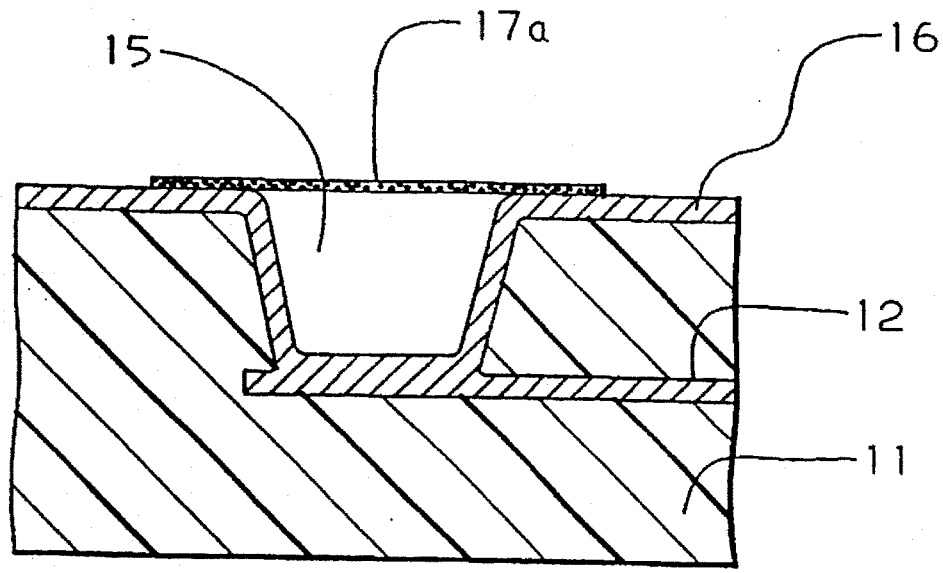
Figure 6:
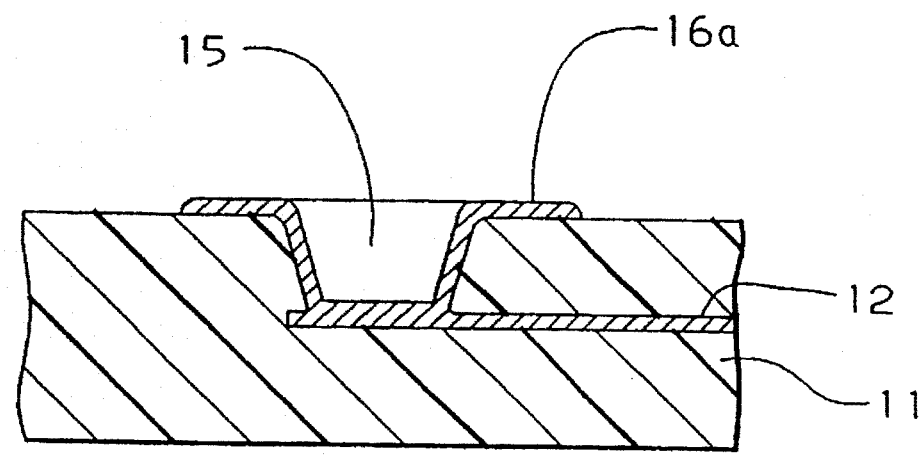

This invention will be described with reference to a preferred embodiment. FIG. 1 schematically illustrates the configuration of a printed circuit board according to an embodiment of this invention, FIG. 1 (A) is a partially cutaway perspective illustration and FIG. 1 (B) is a sectional view thereof. As these drawings show, on a substrate 21 is formed a blind hole 23 extending to an inner wiring 22 (lower wiring), the diameter of which gradually increases from the bottom towards the opening, and on the bottom and the internal wall of the blind hole is formed a conductor pattern 25 connecting the inner wiring 22 with the upper wiring, for example, the top wiring 24. Here, the conductor pattern 25 other than the connection to the top wiring 24 is within the blind hole 23. Therefore, no land exists around the opening of the blind hole 23, which is advantageous to make wiring density higher.

An example of manufacturing such a printed circuit board will be described with reference to FIG. 2. As FIG. 2 shows, an insulative photosensitive resin layer 21b is formed to cover the inner wiring 22 which is a lower wiring consisting of, for example, a copper plated layer formed on the substrate 21a (FIG. 2(a)). The photosensitive resin layer 21b is irradiated through the masking pattern 26 having a mask 26a the size of the blind hole to expose the resin layer 21b outside the masked area (FIG. 2(b)), and developed to form the blind hole 23 extending to the inner wiring 22 on the substrate 21 (FIG. 2(c)). Here, the blind hole 23 has a shape, the diameter of which increases gradually from the bottom towards the opening. Next, a conductor layer 25' is formed consisting of, for example, a copper plated layer on the bottom and the internal wall of the blind hole 23 and the surface of the substrate 21 (FIG. 2(d)). A positive photoresist layer 27 is then formed on the conductor layer 25' using a means such as electro-deposition. The system is then irradiated through a masking pattern 28 having a mask 28a of a size slightly larger than the bottom of the blind hole 23 but smaller than the opening of the blind hole 23 so as to cover the bottom even if a certain misalignment is taken into consideration (FIG. 2(e)). At this time, although the photoresist layer 27 on the internal wall of the blind hole is also irradiated, the light energy supplied to the photoresist is less than that applied to other areas, because this area is slanted by, for example, 60–70 degrees against the light irradiating direction. By subsequent developing, therefore, a resist pattern 27a is formed on the bottom of the blind hole 23 as well as the internal wall, but the resist around the opening is completely removed (FIG. 2(f)). By further etching, a conductor pattern 25 connected to the inner wiring 22 is formed in the bottom and the internal wall of the blind hole 23, but no land is formed around the opening of the blind hole 23. The subsequent steps follow known methods, that is, the upper wiring such as the top wiring (not shown) connected to this conductor pattern 25 is formed by applying a photoresist layer again on the surface of the substrate 21, exposing the photoresist layer through a masking pattern, developing, and etching again. By this, the printed circuit board in which inner wiring are connected with the surface wiring through the conductor pattern 25 can be obtained (see FIG. 1).

By using such a manufacturing process, the conductor pattern can be formed on the bottom and the internal wall of the blind hole without the accurate alignment of the masking pattern necessary in conventional methods, because the misalignment of the positive photoresist layer and the masking pattern is compensated by the internal wall of the blind hole.

For example, when the depth of the blind hole is 80 microns, the diameters of its bottom and opening are normally 150 microns and 280 microns, respectively. If the conductor layer is etched using a dry-film photoresist, as in conventional methods, a land with a diameter of about 410 microns is formed around the opening, when the misalignment of the photoresist layer and the masking pattern is considered. By the method described above, however, since no land is formed, considerable space savings can be achieved.

Advantages over the Prior Art

As described above, since the inner wiring is connected to the lower wiring through the conductor pattern on the bottom of the blind hole, and is connected to the upper wiring through the conductor pattern on the internal wall of the blind hole, and the land around the opening of the blind hole is eliminated according to this invention, a printed circuit board with highly reliable connection between upper and lower wiring, as well as high wiring density, can be provided.

Alternative Embodiments

It will be appreciated that, although specific embodiments of the invention have been described herein for purposes of illustration, various modifications may be made without departing from the spirit and scope of the invention. In particular, although the embodiment was described mainly for connection of upper and lower wiring, it will be understood by those skilled in the art that this invention can be applied to multilayer wiring of three or more layers by repetition of such manufacturing steps.

Accordingly, the scope of protection of this invention is limited only by the following claims and their equivalents.

We claim:

1. A process for producing a printed circuit board comprising the steps of:

forming a blind hole within a printed circuit board including an upper opening, sloped internal wall and a bottom, said printed circuit board further having inner layer wiring, said blind hole extending to said inner layer wiring, said upper opening of said blind hole being larger than said bottom thereof;

forming a conductor layer at least around said blind hole, on said bottom of said blind hole, and on said sloped internal wall of said blind hole, said conductor layer being connected with said inner layer wiring; forming a photoresist layer on the surface of said conductor layer;

positioning a light mask pattern larger than said bottom of said blind hole but smaller than said upper opening of said blind hole in an aligned position over said bottom of said blind hole;

forming a photoresist pattern on substantially only said bottom and said sloped internal wall of said blind hole by exposing said photoresist pattern through said light mask pattern; and removing the portion of said conductor layer not covered by said photoresist pattern to define a conductor pattern on substantially only said bottom and said sloped internal wall of said blind hole.

2. The process of claim 1 wherein said photoresist layer is formed on said surface of said conductor layer using electro-deposition.

3. The process of claim 2 wherein said portion of said conductor pattern is removed using an etching process.

4. The process of claim 1 further including the step of providing wiring on said printed circuit board and connecting said wiring to said conductor pattern.

* * * * *